United States Patent [19]
Hassard et al.

[11] Patent Number: 6,011,296
[45] Date of Patent: Jan. 4, 2000

[54] OPTOELECTRONICALLY GATED MICROSTRUCTURE

[75] Inventors: John Francis Hassard; Roland Smith, both of London, United Kingdom

[73] Assignee: Imperial College of Science, Technology & Medicine, Longdon, United Kingdom

[21] Appl. No.: 09/029,445
[22] PCT Filed: Aug. 30, 1996
[86] PCT No.: PCT/GB96/02100
    § 371 Date: May 7, 1998
    § 102(e) Date: May 7, 1998
[87] PCT Pub. No.: WO97/09744
    PCT Pub. Date: Mar. 13, 1997

[30] Foreign Application Priority Data

Sep. 1, 1995 [GB] United Kingdom ............... 9517927

[51] Int. Cl.$^7$ .......................................... H01L 31/0312
[52] U.S. Cl. ........................... 257/448; 257/77; 257/459
[58] Field of Search ................................. 257/290, 294, 257/434, 435, 446, 448, 459, 664, 77

[56] References Cited

U.S. PATENT DOCUMENTS 4,360,246 11/1982 Figueroa et al. .
4,899,200 2/1990 Shur et al. .
5,107,315 4/1992 Kumagai et al. .
5,233,556 8/1993 Matsuda et al. .
5,345,075 9/1994 Tonai et al. .......................... 250/227.24
5,506,422 4/1996 Dreifus et al. .

FOREIGN PATENT DOCUMENTS

WO 92/20105 12/1992 WIPO .
WO 95/12134 4/1995 WIPO .

OTHER PUBLICATIONS

Applied Physics Letters, vol. 41, No. 7, Oct. 1982, pp. 599–601, Auston D.H. and Smith P.R. entitled "Picosecond Optical Electronic Sampling: Characterization of High–Speed Photodectors."

Applied Physics Letters, vol. 54, No. 6, Feb. 6, 1989, pp. 543–545, Taylor G.W. et al. entitled "Optoelectronic Dynamic Random Access Memory Cell Utilizing a Three–Terminal N–Channel Self–Aligned Double–Heterostructure Optoelectronic Switch."

Primary Examiner—Ngân V. Ngô
Attorney, Agent, or Firm—Wallenstein & Wagner, Ltd.

[57] ABSTRACT

A solid state microstructure comprises a substrate (10,50, 80), a detector element extending outwardly from a surface of the substrate and having first (14,60,88) and second (16,64,90) electrodes on opposing sides thereof, the detector element incorporating an onboard optoelectrically-triggered gating structure. Gating may be achieved by flooding a specified area of the detector element with gating light, preferably from a laser, thereby causing that region to become conductive.

39 Claims, 1 Drawing Sheet

OPTOELECTRONICALLY GATED MICROSTRUCTURE

DESCRIPTION

TECHNICAL FIELD

The present invention relates to a solid state microstructure, and particularly to a microstructure having an optoelectronically triggered onboard gating arrangement.

BACKGROUND OF THE INVENTION

Many imaging and probing applications in the infrared and visible light regions (lidar, mammography), in the UV and x-ray regions (medical imaging), and applications using ionising particles, suffer from scattering problem. Typically, scattered photons or particles which do not pass directly from the source to the object and to the detection system result in noise. This noise may greatly degrade the desired signal or image, particularly in the case of soft tissue probing by use of visible or infra-red laser light. In many applications, the image can greatly be improved by the use of a time-resolved or a time-gated detection system.

Such systems are currently complex and expensive, and currently are conceived as separate add-on units which are normally used in conjunction with conventional detectors. Gating using light, for example, is conventionally carried out using the relatively expensive device known as a pockels cell.

Similar problems apply to particle detection techniques such as slow neutron imaging. Time gating in the sub-nanosecond range, particularly with silicon detectors, can be difficult. In the x-ray range the time gate of, of example, microchannel plate devices can approach the loops range, and the best spatial resolution which can be obtained in the dimension along the line of the light without some sophisticated deconvolution technique, for example, is thus of order a few-cm. This is inadequate for most useful medical imaging techniques.

The time resolution of these gated structures is accordingly not entirely satisfactory, and generally depends upon a combination of the rise time of the gating pulse, and the response of the detector.

SUMMARY OF THE INVENTION

It is an object of the present invention at least to alleviate the problems of the prior art.

It is a further object to provide a solid state microstructure detector which can be gated very rapidly and which does not require a separate gating element such as a pockels cell.

According to the present invention there is provided a solid state (switch) microstructure comprising a substrate, a detector element extending outwardly from a surface of the substrate and having first and second electrodes on opposing sides thereof, the detector element incorporating an onboard optoelectronic gating structure.

For the ultra-violet region of light below about 224 nm, the substrate is preferably made of UV sensitised silicon, or more simply, chemical vapour deposition (CVD diamond. For the visible region, and the infra-red region, silicon, gallium, arsenide and indium phosphide are suitable detector materials, among other solid state materials.

Such an arrangement can give exceptionally high electrically controlled gating speeds for photon and particle detection across the visible, UV and x-ray range, and also for neutrons. X-ray detectors will normally—but not exclusively—incorporate high z materials in front of the detector medium. In exceptional cases, it may be necessary for the detector to have low efficiency to avoid electronic pile-up. For neutron detection, low z materials may be incorporated in front of the plane of, between the individual elements of, or actually within, the detector material.

The advantages of using diamond are many fold. Diamond can be made extremely transparent in the wavelengths greater than 224 nm, and it is also the best heat conductor and diffuser known, at room temperature. Due to the small voltage required efficiently to extract electron-hole pairs, the gate voltage can be relatively small, and therefore easily generated with a fast rising and falling edge. This contrasts with the kV range required to gate channel plate devices.

The gating structure may be optically driven, for example from an onboard or off-board laser diode. In a typical arrangement, a radiation-sensitive region of the detector is contiguous with a gated region of the detector. When a light pulse is flooded into the gated region, that region becomes conductive, thereby allowing a current to pass from the first electrode via the sensitive region and the gated region to the second electrode. If the conductivity of the gated region can be made sufficiently high, the current that is passing will depend wholly or substantially upon the conductivity of the radiation sensitive region. That, in turn, depends upon the radiation flux that is falling on the sensitive region. The radiation flux may, of course, comprise electromagnetic radiation or ionising particles, depending upon the type of detector in question.

In one preferred embodiment, the radiation sensitive region is open to the radiation flux that is shielded from the optical gating pulse. The contiguous gated region is not shielded either from the radiation or from the gating pulse.

In an alternative arrangement, the radiation sensitive region is shielded from the optical gating pulse, and the gated region is shielded from the radiation flux.

The gated region and the radiation sensitive region may be formed of the same block of material, for example of a single block of CVD diamond. However, the sensitive region and the gated region may be provided with different physical characteristics, either by growing the region separately or by subsequent treatment (for example by ion bombardment).

It is not necessary for the sensitive region and the gated region to touch each other in every embodiment. Since all that is required is for current to be able to pass from one region to the other, in one embodiment the two regions may be separated by an intermediate conductive region, for example an intermediate metallic electrode.

The invention extends to a multi-strip array detector comprising a plurality of solid state microstructures as previously defined, all on a single substrate. The size of the individual microstructures may be smaller than 500 micrometers in dimensions perpendicular to the incident radiation, and typically of order ten micrometers. We envisage more advanced manufacturing technologies being able to reach sub micrometer structures in the immediate future. The multi-strip detector may comprise a plurality of individual ridge detector elements each having first and second electrodes on opposing sides thereof, and the detector elements may be commonly gated.

The invention extends to any one or more features described, shown in the drawings or claimed, whether taken alone or in any compatible combination.

BRIEF DESCRIPTION OF THE DRAWINGS

The invention may be carried into practice in a number of ways, and several specific embodiments will now be described, by way of example, with reference to the accompanying drawings, in which.

DETAILED DESCRIPTION OF THE PREFERRED EMBODIMENTS

Figure 1:
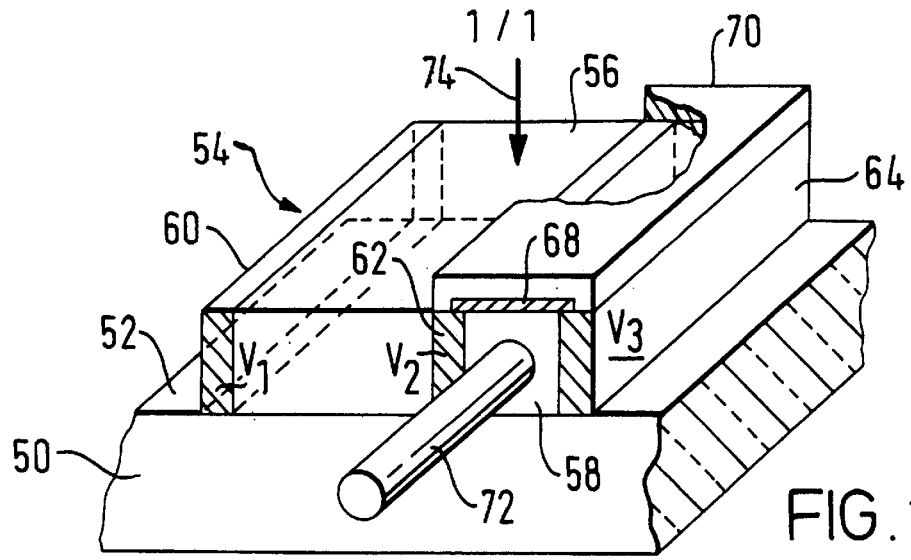
FIG. 1 shows an ultra-fast optically gated detector microstructure for time resolved detection of visible, UV and X-ray photons, and ionising particles.

The embodiment of FIG. 1 comprises a sapphire substrate 50 having an optical quality upper surface 52 which is flat to within about $\lambda/10$. Deposited on the surface 52 there is a detection structure 54 comprising an elongate CVD diamond sensitive area 56, and a parallel elongate CVD diamond gate channel 58. The sensitive area 56 is bounded along its two parallel sides by first and second metallisation layers 60,62, the second of which also forms one of the boundaries to the diamond gate channel 58. On the far side of the gate channel there is a third parallel metallisation layer 64. Covering the gate channel 58 from above is an opaque closure layer 68 which is itself covered by a non-conductive light shield 70. The light, pipe closure layer may be of any suitable non-conductive material, for example of sapphire or SIO2.

The gate channel 58 is accordingly bounded by metal layers 62,64 on two sides, by the sapphire substrate 50 below and by the closure layer 68 above. These boundaries and sharp changes in refractive index form a light pipe, which allows a short optical laser pulse 72 to be guided down the gate channel. The gate pulse is provided by a picosecond or sub-picosecond optical laser (not shown).

In use, the photon or particle flux 74 to be detected impinges upon the upper surface of the detection structure 54. The flux penetrates into the sensitive area 56, but is shielded from the gate channel 58 by the closure layer 68 and the light shield 70. The purpose of the light shield is to ensure that the flux falling on the device does not generate electron-hole pairs in the gate channel. The short wavelength cutoff of the device is limited by the ability of the light shield 70 to block incident radiation.

The device is biased such that $V_1 < V_2 < V_3$, where $V_1$, $V_2$, $V_3$ are respectively the voltages on the metallisation layers 60,62,64. When a flux 74 is present, electron-hole pairs are produced in the sensitive area 56 by the interaction of photons or charged particles. In the ungated state (when no electron-hole pairs are present in the gate channel 58) there is no net current flow from the first metallisation layer 60 to the third metallisation layer 64, other than a very small leakage current, which in diamond can be made much less than 20 pA.

The device is gated by injecting a relatively bright optical gate pulse 72 at a wavelength of around 500–550 nm into the gate channel 58. This saturates the gate and causes the current flow from the first metallisation layer 60 to the third metallisation layer 64 to be determined substantially or entirely by the radiation flux 74 falling on the sensitive region.

The gate time is determined by the optical gate pulse length, or the charge carrier recombination time in the gate channel, whichever is the longer. The gate can thus be of the order of a few tens of picoseconds. The optical gate pulse length can be made extremely small (<100 femtoseconds) while the recombination time can be made arbitrarily small by growing or implanting defects or by damaging the lattice, and hence reducing the charge carrier lifetime, by radiation damage, in the gate material. If required, the gate material can be made with different recombination characteristics from the material in the sensitive area, again by growth, ion implantation, or selective radiation damage.

The device shown in FIG. 1 may be constructed either as a single strip or as a plurality of coupled strips to increase the sensitive area. This may be particularly useful in areas such as lidar, where the gate may be synchronised with a repetitive optical signal (which could in principle be the same lidar pulse). Reading out multiple strips separately will give a device with one degree of spatial resolution.

A suitable source of gating pulses may be an external short pulse laser oscillator, or an on-chip laser diode. Diamond light pipes may be fabricated on-chip to guide the gating pulse to a plurality of different detection strips. If the gate pulses to a multiple-strip device are sent along varying path lengths, for example through a range of different length optical fibres or on-chip light guides, then the strips will be activated at different times. This provides an accurate and reproducible way of scanning a wide range of gate times on a single shot with one device. We can also envisage a phased array structure with this mechanism.

FIG. 5 shows a further embodiment.

The device shown comprises a transparent substrate 80 which may be either of sapphire or of a low-recombination length CVD diamond. The substrate has an optical-quality upper surface 82 which is accurate to about $\lambda/10$. Formed on the surface is a ridge structure 84 comprising a CVD diamond ridge 86 bounded along its parallel sides by respective first and second metallisation layers 88,90. Part of the ridge is shaded from light from below by an opaque layer 92, thereby splitting up the ridge into two volumes: a detection region 94 and a gate region 96. The photon or particle flux 98 to be detected impinges upon the device from above.

The voltages applied to the first and second metallisation layers 88,90 (respectively $V_1$ and $V_2$) give a potential difference across the ridge of the order of 50V. The recombination length of the CVD diamond comprising the ridge structure, and the width of the ridge, are chosen such that there is high probability of an electron-hole pair created in the sensitive region of the diamond being trapped by a defect, or recombining, before giving rise to a photocurrent. That is, the recombination length is chosen to be slightly more than half the width of the ridge. The device is then gated by back illumination with a short optical pulse 100 in the 500–550 nm region. The sensitive or detection region 94 of the CVD diamond is shadowed from the gating pulse by the opaque layer 92, and no additional electron-hole pairs are produced here. However, on the unshadowed side of the device, large numbers of electron-hole pairs are generated by the gate photons 102 which have passed through the transparent substrate 80. The gate region 96 accordingly becomes conductive for the recombination time of the electron-hole pairs, or the optical gating pulse duration, whichever is the longer. The gate can thus be made as short as a few tens of picoseconds. The net conduction across the device, between the metallisation layers 88 and 90 is determined by the photon or particle flux 98 which is impinging upon the detection region 94 (provided that this flux is much lower than the bright optical gating pulse 100. Note that this configuration can also be made to act as an ultra-fast optoelectronic AND switch: when the gate photons 102 and the incoming photons 98 (both of which can be made in pulses of tens of picoseonds) coincide temporally, the opto-electronic switch defined by the leakage current turns on.

Figure 3:
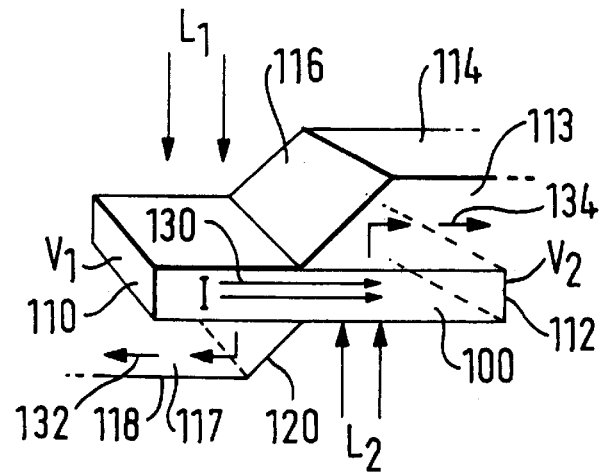
FIG. 3 shows a further embodiment, arranged to operate as an AND gate.

An alternative embodiment, designed specifically as an AND gate, is shown in FIG. 3. The gate comprises a transparent planar substrate 100, which may for example be of sapphire or of low-recombination length CVD diamond. On opposing parallel faces of the substrate are first and second metallisation layers or electrodes 110,112. On an upper face of the substrate there is a transparent light guide/prism 113 having an upper surface 114 which is parallel to the plane of the substrate 100, and an angled reflecting surface 116. Likewise, on the lower surface of the substrate 100 there is a similar lower light guide/prism 116, having a lower surface 118 which is parallel to the substrate 100, and an angled reflecting surface 120.

In operation, two light beams or light pulses $L_1$, $L_2$, are applied to the substrate from opposite sides. The pulse $L_1$ enters at one end of the substrate, passes through the substrate, and is reflected by the surface 120 into the lower light guide/prism 116. The pulse $L_2$ enters at the upper end of the substrate, passes through the substrate and is reflected along the length of the upper light guide/prism by the surface 117. A current I flows in the direction of the arrows 130 when both the illumination $L_1$ and the illumination $L_2$ is turned on. Accordingly, the device acts as an optical AND gate.

It will be understood that the upper surfaces 114,117 and the lower surfaces 118, 120 may have applied to them a coating which is opaque to light, thereby avoiding the possibility of the illumination $L_1$ entering the light guide/prism 113, or the illumination $L_2$ entering the light guide/prism 117.

In an alternative version of this embodiment (not shown) the upper and lower light guides/prisms could simply be replaced with opaque coatings on the upper and lower surfaces of the substrate. This of course has the disadvantage that the incoming illumination $L_1$ and $L_2$ does not then exit the device, as it does in the device shown (see the arrows 132,134 respectively).

The device may be constructed either as a single strip, or as a plurality of coupled strips to increase the sensitive area. This latter arrangement may be particularly useful in applications such as lidar, where the gate may be synchronised with a repetitive optical signal (which could in principle be the same lidar pulse). Reading out multiple strips separately will give a device with one degree of spatial resolution. A two-dimensional pixel device may be constructed using a similar structure, and this will allow ultra-fast gated two-dimensional imaging of radiation from the visible to the hard x-ray. It will be appreciated, of course, that such a pixel device can easily be manufactured simply by splitting up the second metallisation layer 90 into a plurality of short individual pixel readout layers spaced longitudinally along the ridge. The two-dimensional capability then comes from providing a plurality of such ridges, each parallel to each other.

Figure 2:
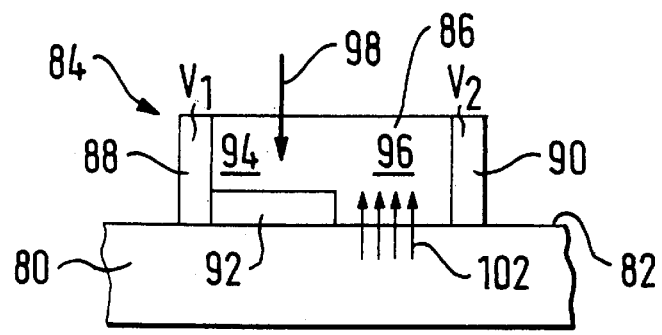
FIG. 2 shows an ultra-fast optically gated backdash illuminated diamond microstructure for time resolved detection of visible, UV and X-ray photons, and ionising particles.

Any of the embodiments of FIGS. 1 to 3 may be adapted as an x-ray detector by the incorporation of additional high z showering material, positioned immediately in front of the detector. Likewise, any of the embodiments may be suitable for use as a neutron detector, with the addition, either as a separate layer, interdispersed, or implanted or grown into the substrate itself, of a low z showering material.

In the variations comprising a plurality of parallel ridges, absorber material may be located, as necessary, between the parallel sides of adjacent detector elements. The structures described may be etched, artificially grown or manufactured in any other suitable manner.

The invention claimed is:

1. A solid state microstructure comprising:
    a substrate; and,
    a detector element extending outwardly from a surface of the substrate, having first and second electrodes on opposing sides thereof, and incorporating an onboard optoelectronic gating structure.

2. A microstructure as defined in claim 1 wherein the detector element is of diamond.

3. A microstructure as defined in claim 2 wherein the detector element is of chemical vapour deposition diamond.

4. A microstructure as defined in claim 1 wherein the detector element is unitary with the substrate.

5. A microstructure as defined in claim 1 wherein the detector element includes an elongate ridge structure.

6. A microstructure as defined in claim 1 wherein the opposing sides of the detector element are substantially parallel.

7. A microstructure as defined in claim 6 wherein the substrate is generally planar, with the opposing sides of the detector element being substantially normal to the plane of the substrate.

8. A microstructure as defined in claim 1 wherein the gating structure includes an optically gated region arranged to become conductive when a gating light is applied.

9. A microstructure as defined in claim 8 wherein the gated region is arranged to receive a light pulse in a direction parallel to the surface of the substrate.

10. A microstructure as defined in claim 8 wherein the gated region includes a light pipe.

11. A microstructure as defined in claim 10 wherein the detector element includes an elongate ridge structure, the light pipe extending along the length of the ridge structure.

12. A microstructure as defined in claim 10 wherein one side of the light pipe is defined by the surface of the substrate.

13. A microstructure as defined in claim 10 wherein one side of the light pipe is defined by the first or by the second electrode.

14. A microstructure as defined in claim 8 further including radiation shielding means for protecting the gated region from incident radiation.

15. A microstructure as defined in claim 8 wherein the gated region is located adjacent to a radiation-sensitive region, current flowing when the microstructure is gated between the first and second electrodes via the sensitive region and the gated region.

16. A microstructure as defined in claim 15 further including an intermediate conductor between the sensitive region and the gated region.

17. A microstructure as defined in claim 8 wherein the substrate is transparent and the gating light is arranged to be applied to the gated region through the substrate.

18. A microstructure as defined in claim 17 wherein the gated region is located adjacent to a radiation-sensitive region, current flowing when the microstructure is gated between the first and second electrodes via the sensitive region and the gated region.

19. A microstructure as defined in claim 18 further including shielding means arranged to shield the sensitive region from the gating light.

20. A microstructure as defined in claim 19 wherein the shielding means includes an opaque layer between the substrate and the sensitive region.

21. A microstructure as defined in claim 20 wherein the opaque layer lies directly on the surface of the substrate.

22. A microstructure as defined in claim 8 wherein the gating region is located adjacent to a radiation-sensitive region, current flowing when the microstructure is gated between the first and second electrodes via the sensitive region and wherein the gated region, the microstructure further includes light-shielding means arranged to shield the sensitive region from the gating light.

23. A microstructure as defined in claim 8 further including an onboard laser diode arranged to produce the gating light.

24. A microstructure as defined in claim 8 further including an off-board laser arranged to produce the gating light.

25. A microstructure as defined in claim 1 including a plurality of elongate detector elements on the substrate, the detector elements being commonly gated.

26. A microstructure as defined in claim 25 wherein each detector element is read out separately.

27. A microstructure as defined in claim 26 wherein each detector element has a plurality of second electrodes, spaced along its length, each second electrode being read out separately.

28. A microstructure as defined in claim 25 wherein the detector elements are gated by a common onboard laser.

29. A microstructure as defined in claim 25 wherein the laser is arranged to produce a gating light pulse, the pulse being arranged, by means of optical delay lines, to gate the detector elements at different times.

30. A microstructure as defined in claim 29 wherein the optical delay lines are onboard light guides.

31. A microstructure as defined in claim 29 wherein the optical delay lines are off-board optical fibres.

32. A microstructure as defined in claim 25 wherein the detector elements are gated by a common off-board laser.

33. A microstructure as defined in claim 32 wherein the laser is arranged to produce a gating light pulse, the pulse being arranged, by means of optical delay lines, to gate the detector elements at different times.

34. A microstructure as defined in claim 33 wherein the optical delay lines are onboard light guides.

35. A microstructure as defined in claim 33 wherein the optical delay lines are off-board optical fibres.

36. A microstructure as defined in claim 1 wherein the gating structure is arranged to operate as an AND gate, responsive to first and second optical inputs.

37. A microstructure as defined in claim 36 further including means for coupling out the first and second optical inputs.

38. A microstructure as defined in claim 36 wherein the means for coupling out the first and second optical inputs includes a first light guide on an upper surface of the substrate and a second, light guide on a lower surface of the substrate.

39. A microstructure as defined in claim 38 wherein the first and second light guides include respective reflective surfaces for coupling out the optical inputs in first and second directions which are substantially parallel to a general plane of the substrate.

* * * * *

UNITED STATES PATENT AND TRADEMARK OFFICE
CERTIFICATE OF CORRECTION

PATENT NO. : 6,011,296
DATED : January 4, 2000
INVENTOR(S) : John Francis Hassard and Roland Smith It is certified that errors appear in the above-identified patent and that said Letters Patent is hereby corrected as shown below:

Col. 1, line 34, delete "loops" and insert therefor --100mps--.
Col. 7, line 24, delete "claim 25" and insert therefor --claim 28--.

Signed and Sealed this

Third Day of April, 2001

Attest:

NICHOLAS P. GODICI

*Attesting Officer*     *Acting Director of the United States Patent and Trademark Office*